United States Patent
Chung

(10) Patent No.: US 6,200,073 B1
(45) Date of Patent: Mar. 13, 2001

(54) COMBINATION CHAMFERING AND MILLING TOOL

(76) Inventor: Henry Chung, 3478 Del Norte Dr., San Jose, CA (US) 95132

(*) Notice: Subject to any disclaimer, the term of this patent is extended or adjusted under 35 U.S.C. 154(b) by 0 days.

(21) Appl. No.: 09/420,178

(22) Filed: Oct. 18, 1999

(51) Int. Cl.[7] ............................. B23B 51/08; B23B 27/10
(52) U.S. Cl. ........................... 407/53; 408/59; 408/224; 279/105.1
(58) Field of Search ................... 407/53, 54, 55, 407/42, 31, 34; 408/224, 59; 279/105.1

(56) References Cited

U.S. PATENT DOCUMENTS

| | | | |
|---|---|---|---|
| 2,429,375 | * | 10/1947 | Smith ................................. 408/224 |
| 2,470,218 | * | 5/1949 | McNamara ....................... 279/105.1 |
| 2,705,515 | * | 4/1955 | Walker .............................. 408/224 |
| 2,937,029 | * | 5/1960 | Colby .................................. 279/20 |
| 2,985,468 | * | 5/1961 | Shaw et al. ......................... 279/20 |
| 3,024,030 | * | 3/1962 | Koch .................................. 279/20 |
| 5,085,540 | * | 2/1992 | Pagliaccio .......................... 408/56 |
| 5,152,541 | * | 10/1992 | Baumgartner et al. ............... 279/8 |
| 5,378,091 | * | 1/1995 | Nakamura .......................... 407/53 |
| 5,482,410 | * | 1/1996 | Chambers ......................... 408/224 |

* cited by examiner

Primary Examiner—A. L. Wellington
Assistant Examiner—Erica Ergenbright
(74) Attorney, Agent, or Firm—Robert Samuel Smith

(57) ABSTRACT

A combination chamfering tool and cutting tool for a milling machine that machines a wall and leaves a chamfered corner including a shaft having one section (12) dimensioned to slip into a mill collet. Another larger cylindrical section (14) is joined end-to-end with the one section and has a conical end (16). A pair of cutting flutes (18) are formed on the conical surface (16). A central bore (20) extends the entire length of the shaft and is dimensioned to accept a mill cutter (22) slip fitted into the bore (20). A set screw (24) secures the cutter (34) in the bore (20). In one embodiment, a part of the bore is threaded and an allen screw (34) is a positioning stop for the cutter (22). In another embodiment, a cylindrical sleeve is journalled onto the shaft forming a chamber. An aperture is formed in the sleeve and a groove is formed in the axial direction on the surface of the bore so that lubricant can be admitted through the aperture in the sleeve, through the chamber, down the groove and onto the surface of the work piece being cut.

2 Claims, 2 Drawing Sheets

COMBINATION CHAMFERING AND MILLING TOOL

FIELD OF THE INVENTION

This invention relates to machine tools and particularly to a tool attachable to a mill for performing a milling and chamfering operation simultaneously.

BACKGROUND AND INFORMATION DISCLOSURE

For the purposes of this disclosure, a milling operation in a machine shop refers to the practice of securing, a work piece in a vise that is clamped to a table that can be moved with three degrees of freedom against a rotating toolbit (cutter) that cuts away portions of the work piece in accordance with a require plan. The rotational axis of the toolbit is maintained stationary and is generally vertical. The various operations that can be performed with this arrangement include drilling holes and cutting linear slots and chamfering the edges of holes and slots. Common practice is to machine the work piece having complex surfaces using a toolbit designed for the specific operation. For example, the operation of drilling a hole requires a drill bit. moving the work piece in a linear direction so as to cut a straight groove or form a flat surface on the part requires an end mill, having a cylindrical shaft with radially extending cutting flutes.

Most jobs involve various operations in combination so that any given job usually requires several different toolbits. This necessitates performing one operation with one toolbit and then changing the toolbit to peform another operation. As a result of this situation, the present state of the art equipment has arrangements such as "quick-change" chucks, brakes, automated too changers, etc. for reducing the accumulated "down time" of the machine required for changing the tool.

A very frequent requirement for many designs is the requirement to chamfer the edge of a slot that has been cut by an end mill. Milling the slot in a first operation, changing the tool bit from an end mill to a chamfering tool and then milling the chamfer takes at least twice the time of simply milling a slot (without chamfer). A milled slot leaves a corner that has to be deburred so that, even when no cramfer is required, the careful workman will go back over the work piece and "break the edge" with a debuning tool. Another factor that adds time and expense to a milling operation involving machining an opening in a group of "boards" such as in the manufacturing of frames for a printed circuit operation is the requirement to lubricate the part with an appropriate coolant. The coolant is typically a water base lubricant and a popular method of applying the lubricant is to direct a fine spray on the surface of the part. This method is inefficient from the standpoint that the lubricant lands on a broad surface of the part far removed from the exact location where the lubricant is needed. This location is on the cutter blade about 0.050 inches from where the chip separates from the metal and where the chip rubs against the cutter surface thereby generating excessive heat.

Yet another inconvenience associated with the job of milling an opening in a group of plates is that the cutting edge of the tool bit wears and the toolbit flexes so that sources of variations are introduced which result in loss of precision in machining the workpiece.

SUMMARY OF THE INVENTION

It is an object of this invention to provide a toolbit and method of machining using the tool bit for a machining operation that performs a milling operation and a chamfering operation simultaneously.

It is another object of this invention to provide a method of lubrication that is more effective than is provided by present practice in terms of delivering the lubricant in the right amount to the light location.

It is another object to avoid delays incurred by tool changes that characterize present methods of machining.

This invention is directed toward a combination milling bit and chamfering bit including a chamfering member being a shaft with a center bore. The shaft has on at least one end a substantially conical surface with a radially disposed cutting edge. A conventional end mill fits into the bore and where it is secured by a set screw screwed into the side of the shaft and communicates with the bore.

In one embodiment, a length of the bore distal from the chamfer cutting end of the shaft is threaded and an alien head screw is threaded into the bore. The screw serves as a positioning stop a mill having its shank (non-cutting end) inserted into the bore so that the length of the milling tool extended from the tip end of the chamfer can be firmly set and subsequently be repositioned in order to present an unused portion of the edge of the cutting flute.

In yet another embodiment, a cylindrical chamber is formed between the outer shaft surface and a cylindrical sleeve journaled onto the shaft. The sleeve, being journaled onto the shaft, is stationary and the chamber communicates with a source of lubricant through an entry port in the side of the sleeve. The lubricant is enabled to flow through an aperture in the shaft leading from the chamber to the bore of the shaft, down a groove in the side of the bore and out onto the surface of the work piece being machined at the location where cutting is actually taking place.

DESCRIPTION OF PREFERRED EMBODIMENTS

Figure 1:
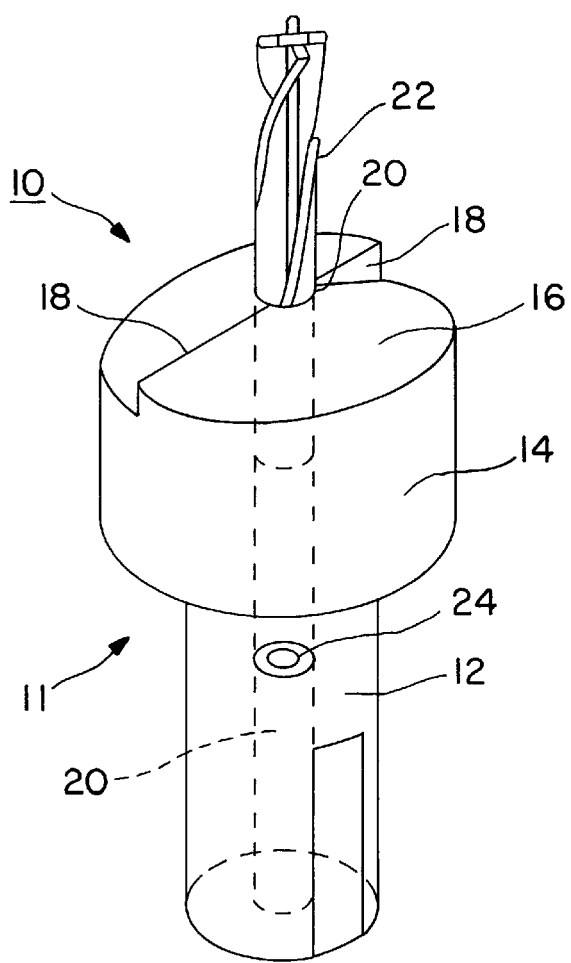
FIG. 1 is a perspective view of the combination chamfering and milling tool.

Turning now to a discussion of the drawings, FIG. 1 is a perspective view of an embodiment of the machine tool of the invention 10.

There are shown one section 12 of a shaft 11 dimensioned to slip into the collet of a milling machine (collet not shown) and another section 14 having a bevelled surface 16 on one end. The surface of the cone has two radial flutes 18, each with a cutting edge.

The shaft 11 also has a bore 20 concentric with the shaft 11 and extending the full length of the shaft 11.

A milling cutter 22 is inserted into the bore 20 and secured by a set screw 24 that enters a side of the shaft.

When the shaft is chucked in the mill and rotated, the rotating cutter moved against and parallel to an edge of work piece will machine a surface parallel to the axis of rotation of the toolbit and (when positioned correctly) will simultaneously bevel the corner edge created in the work piece.

Figure 2:
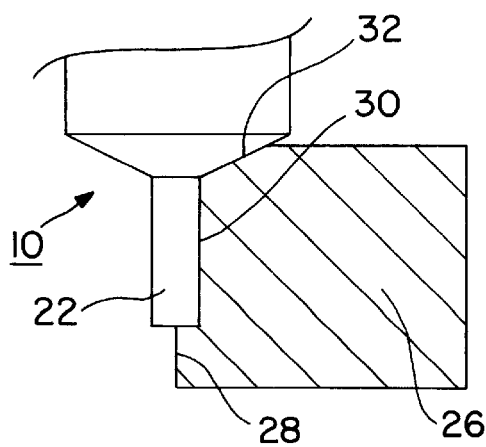
FIG. 2 is a sectional view of the cutout made by the tool of this invention.

FIG. 2 shows the invention 10 and a sectional view of a work piece 26 with the invention performing the combination chamfering and milling cutter adjacent the along a wall 28 of the work piece 26. The section 30 of wall cut by the cutter 22 is shown and the bevel section 32 cut by the chamfering section of the invention is also shown.

Figure 3:
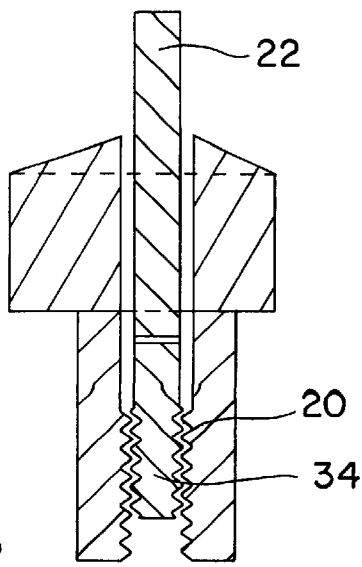
FIG. 3 is a sectional view showing a a tool stop.

FIG. 3 is a sectional view a variation of the invention in which, the bore 20 is partially threaded from the end of the bore 20 opposite the flutes to a location that is part way through the bore 20 . A set screw 34 in the threaded portion of the bore functions as an adjustable stop for the mill inserted into the bore. This feature prevents inadvertent axial shift of the mill during the cutting operation.

The capability to adjust the length of insertion of the milling cutter into the bore is also useful for the situation where the cutter is being used to machine cutouts in plates that are thin compared to the length of the cutter. In such an operation, it is desirable to have the area of the work piece being cut close to the support of the cutter (the end of the cone) in order to minimize loss of precision due to deflection of the cutter. As the cutter in a given area wears, the cutter is shifted axially in the bore by an amount that is controllable by the setting of the screw in the bore.

Figure 4:
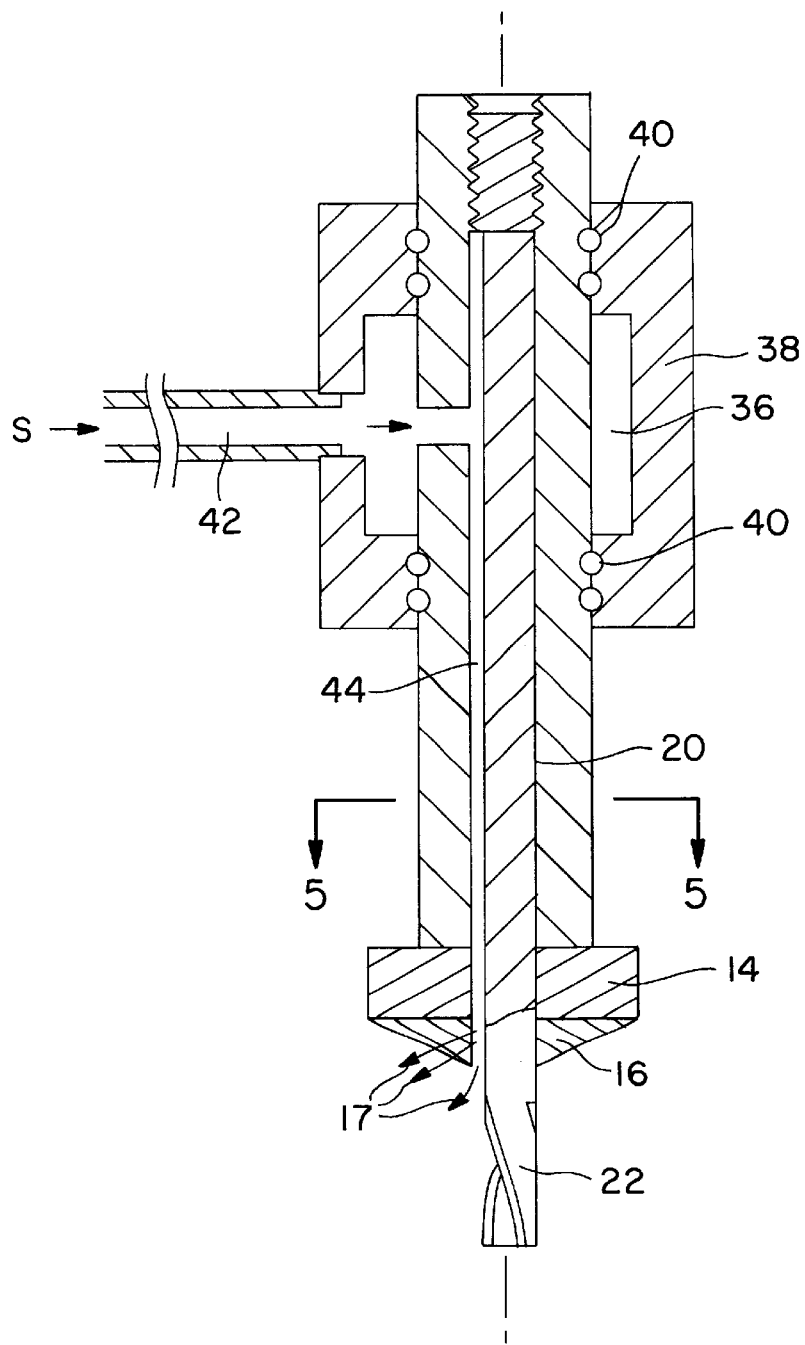
FIG. 4 is a sectional view of the lubricating system of the invention.
Figure 5:
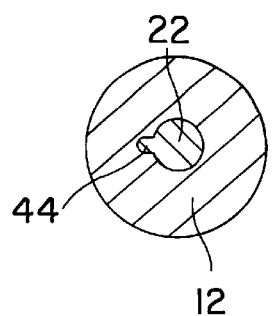
FIG. 5 is another sectional view of FIG. 4.

FIG. 4 shows a sectional view and FIG. 5 is a sectional view taken along line of sight of another embodiment of the invention in which a cylindrical chamber 36 is formed between the outer shaft surface and a cylindrical sleeve 38 journaled onto the shaft 12 by bearings 40. The sleeve 38, being journaled onto the shaft 12, is stationary and the chamber 36 communicates with a source of lubricant S through an entry port 42 in the side of the sleeve 38. The lubricant is enabled to flow from the chamber 36 to the bore 20 of the shaft 12, down a groove 44 in the side of the bore 20 across the flutes of the cutting mill and chamfer toolbits (as shown by the arrows 17) and out onto the surface of the work piece (work piece not shown) being machined at the location where cutting is actually taking place. This method of lubrication is therefore much more economical than, for example, the method using a spray mist which deposits lubricant over a wide area of the work piece as well as the machining equipment.

There has been described a combination milling cutter and chamfering tool with which an operator can perform a milling and chamfering operation simultaneously. The use of the tool presents a number of advantages including cutting in half the time required to perform the operation of milling and chamfering and improved lubrication leading to a better machined part particularly in terms of surface finish. Variations and modifications of the invention may be suggested by reading the specification and studying the drawings which are within the scope of the invention. For example, the conical surface may have one, two or more cutting flutes.

I therefore wish to define the scope of my invention by the appended claims.

I claim:

1. A chamfering tool and end mill, mountable in the chuck of a milling machine, for use with an end mill in performing a milling and chamfering operation simultaneously, which comprises:

a cylindrical shaft mountable in the chuck of the milling machine;

said shaft having a cone on one end thereof whose axis is concentric with an axis of said shaft;

said cone on one end of said shaft having a bevelled surface with at least one radially extending cutting flute said shaft having a bore whose axis is concentric with said shaft axis which extends from one end of said shaft to an opposite end of said shaft having a diameter selected to permit slip fitting a shank end of the end mill into said bore with a cutting end of said end mill extending away from an apex of said cone;

an aperture threaded to receive a setscrew which aperture is perpendicular to said axis of said shaft and extending from a cylindrical surface of said shaft to said bore close to said conical end providing that a set screw is enabled to be screwed into said threaded aperture and secure an end mill inserted in said bore, a section of said bore having a thread providing that a screw threaded into said bore performs as a positionable stop against a shank end of an end mill inserted into said bore.

2. The tool of claim 1 which further comprises:

a cylindrical sleeve journalled by beatings onto said shaft;

a chamber bounded by an inner surface of said cylindrical sleeve, an outer surface of said shaft, one of said bearings on an end of said chamber, another one of said bearings on an opposite end of said chamber;

a passage through a wail of said cylinder;

a passage through said shaft;

an axial groove in a surface of said bore;

said axial groove, said passage through said shaft, said chamber, said passage through said wall, all arranged in operable combination to provide that lubricant be permitted to flow from a source of lubricant through said passage through said wall of said cylinder, through said chamber, through said passage through said shaft, through said groove and flow onto a surface of a work piece being machined.

* * * * *